(12) United States Patent
Kanawati et al.

(10) Patent No.: US 10,586,870 B2
(45) Date of Patent: Mar. 10, 2020

(54) WIDE CONTACT STRUCTURE FOR SMALL FOOTPRINT RADIO FREQUENCY (RF) SWITCH

(71) Applicant: Newport Fab, LLC dba Jazz Semiconductor, Inc., Newport Beach, CA (US)

(72) Inventors: Roda Kanawati, Irvine, CA (US); Paul D. Hurwitz, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 5 days.

(21) Appl. No.: 16/116,829

(22) Filed: Aug. 29, 2018

(65) Prior Publication Data

US 2019/0259880 A1    Aug. 22, 2019

Related U.S. Application Data

(63) Continuation-in-part of application No. 15/900,112, filed on Feb. 20, 2018, now Pat. No. 10,325,833.

(51) Int. Cl.
*H01L 29/00* (2006.01)
*H01L 29/786* (2006.01)
(Continued)

(52) U.S. Cl.
CPC .... *H01L 29/78615* (2013.01); *H01L 23/4824* (2013.01); *H01L 29/0649* (2013.01); *H01L 29/1095* (2013.01); *H01L 29/42376* (2013.01); *H01L 29/4975* (2013.01); *H01L 29/66772* (2013.01); *H01L 29/783* (2013.01); *H01L 29/78654* (2013.01)

(58) Field of Classification Search
CPC ........... H01L 29/78615; H01L 29/0649; H01L 29/1095; H01L 29/42376; H01L 29/4975; H01L 29/66772; H01L 29/783; H01L 29/78654
See application file for complete search history.

(56) References Cited

U.S. PATENT DOCUMENTS 6,624,459 B1    9/2003  Dachtera
9,190,479 B1    11/2015 Greenberg
(Continued)

OTHER PUBLICATIONS

Sze, S.M. et al, "Physics of Semiconductor Devices" Third Edition, John Wiley & Sons, inc., 2007, pp. 340-341.

*Primary Examiner* — Nikolay K Yushin
(74) *Attorney, Agent, or Firm* — Bever, Hoffman & Harms, LLP

(57) ABSTRACT

A structure includes channel regions located between source/drain regions, and a polysilicon gate structure including a plurality of gate fingers, each extending over a corresponding channel region. Each gate finger includes first and second rectangular portions extending in parallel with a first axis, and a connector portion that introduces an offset between the first and second rectangular portions along a second axis. This offset causes each source/drain region to have a first section with a first length along the second axis, and a second section with a second length along the second axis, greater than the first length. A single column of contacts having a first width along the second axis is provided in the first section of each source/drain region, and a single column of contacts having a second width along the second axis, greater than the first width, is provided in the second section of each source/drain region.

20 Claims, 9 Drawing Sheets

(51) Int. Cl.
*H01L 29/78* (2006.01)
*H01L 29/06* (2006.01)
*H01L 29/423* (2006.01)
*H01L 29/49* (2006.01)
*H01L 29/66* (2006.01)
*H01L 29/10* (2006.01)
*H01L 23/482* (2006.01)

(56) References Cited

U.S. PATENT DOCUMENTS

| | | |
|---|---|---|
| 9,620,640 B2 | 4/2017 | Hung |
| 2003/0141543 A1 | 7/2003 | Bryant |
| 2009/0039429 A1 | 2/2009 | Huang |
| 2009/0315080 A1 | 12/2009 | Stribley |
| 2012/0205744 A1 | 8/2012 | O |
| 2015/0041917 A1 | 2/2015 | Zhu |
| 2017/0287836 A1 | 10/2017 | Wang |
| 2018/0114801 A1 | 4/2018 | Leipold |
| 2019/0067476 A1 | 2/2019 | Mori |

…

WIDE CONTACT STRUCTURE FOR SMALL FOOTPRINT RADIO FREQUENCY (RF) SWITCH

RELATED APPLICATIONS

The present application is a continuation-in-part of U.S. patent application Ser. No. 15/900,112, "Bent Polysilicon Gate Structure For Small Footprint Radio Frequency (RF) Switch", filed Feb. 20, 2018, by Roda Kanawati, Paul D. Hurwitz and Samir Chaudhry.

FIELD OF THE INVENTION

The present invention relates to a semiconductor structure including a plurality of series-connected silicon-on-insulator (SOI) CMOS transistors, which can be used to implement a radio frequency (RF) switch. More specifically, the present invention relates to the use of a wide contact structure for reducing the layout area required to implement an RF switch.

RELATED ART

FIG. 1 is a circuit diagram of a conventional radio frequency (RF) circuit 100, including an antenna 103, an RF receiver switch 101, an RF receiver port 115, an RF transmitter switch 102 and an RF transmitter port 125. RF receiver switch 101 includes a plurality of high-voltage field effect transistors (FETs) $110_1$-$110_N$, which are connected in series to form a first transistor stack 110, and a plurality of high-voltage FETs $111_1$-$111_N$, which are connected in series to form a second transistor stack 111, wherein the first and second transistor stacks 110 and 111 are connected in parallel. The stacks 110-111 of high voltage FETs $110_1$-$110_N$ and $111_1$-$111_N$ are controlled to route RF signals from antenna 103 to receive port 115. Similarly, RF transmitter switch 102 includes a stack 120 of high-voltage FETs $120_1$-$120_N$, and a parallel stack 121 of high-voltage FETs $121_1$-$121_N$, which are controlled to route RF signals from transmit port 125 to antenna 103. As used herein, an RF signal is defined as a signal having a frequency in the range of about 10 kHz to 50 GHz. The FETs used in the switch branch stack are large, typically 1-5 mm (millimeter) in total width. It is understood that FIG. 1 is a simplified schematic for illustrative purposes and that many features of a full RF switch product related to biasing, voltage balance, etc., are not shown.

Silicon-on-insulator (SOI) CMOS technologies are now the dominant platforms for creating best-in-class radio frequency switch (RFSW) products for handsets and other mobile devices. Thus, transistors $110_1$-$110_N$, $111_1$-$111_N$, $120_1$-$120_N$ and $121_1$-$121_N$ are typically implemented using SOI CMOS transistors. Such SOI CMOS transistors enable the associated RF switches 101 and 102 to transmit RF signals in the range of 0.5 GHz to 6 GHz with a high degree of linearity, while withstanding voltages of 40V to 70V and in an off-state. Because SOI CMOS technology uses standard CMOS technologies and standard cell libraries, RF switches that implement SOI CMOS transistors can be readily integrated into larger system-on-chip (SOC) devices, thereby minimizing fabrication costs. For example, transistors $110_1$-$110_N$, $111_1$-$111_N$, $120_1$-$120_N$ and $121_1$-$121_N$ and the transistors associated with receive port 115 and transmit port 125 may be fabricated on the same integrated circuit chip.

As described herein, an SOI CMOS technology includes any process that can be used to fabricate SOI CMOS transistors. Thus, a process that can be used to integrate the fabrication of both SOI CMOS transistors and other types of transistors (e.g., SiGe BiCMOS transistors) is considered to be an SOI CMOS process.

Typically, the off-state stacks of an RF switch need to hold off relatively high voltage RF signals (e.g., 40-70V). Consequently, RF switches are implemented with SOI CMOS transistors having operating voltages in the 2.5 Volt-5 Volt range. These SOI CMOS transistors are fabricated using process nodes with a minimum feature size of 0.18 microns or greater. In general, the gate length of each of transistors $110_1$-$110_N$, $111_1$-$111_N$, $120_1$-$120_N$ and $121_1$-$121_N$ must be about 0.18 microns or more to provide the required off-state isolation. Note that transistors fabricated using more advanced process nodes (e.g., a 0.13 micron process node) have lower operating voltages (e.g., 1.2 Volts or lower), and are typically not suitable for implementing an RF switch.

FIG. 2A is a top view of a conventional SOI CMOS structure 200, which includes n-channel SOI CMOS transistors 201-203, which are fabricated in an active semiconductor region 210 using a conventional 0.18 micron SOI CMOS process node. FIG. 2B is a cross-sectional view of SOI CMOS structure 200 along section line B-B of FIG. 2A. Note that not all of the elements of SOI CMOS structure 200 are shown in FIG. 2A for clarity. Transistors similar to n-channel SOI CMOS transistors 201-203 are typically used to implement transistors $110_1$-$110_N$, $111_1$-$111_N$, $120_1$-$120_N$ and $121_1$-$121_N$ of RF switches 101 and 102.

Polysilicon gate structure 230 includes a plurality of rectangular polysilicon gate fingers 231-233, which are continuous with a rectangular polysilicon base region 234. The rectangular gate fingers 231-233 extend in parallel with one another, and are separated by spacing, S. As illustrated by FIG. 2B, SOI CMOS transistors 201-203 are fabricated on a SOI structure that includes thin silicon layer 206, which is located on a buried insulating layer 205 (e.g., silicon oxide), which in turn, is located on a substrate 204 (e.g., monocrystalline silicon).

N-channel SOI CMOS transistor 201 includes a rectangular n-type source/drain region 211 (which includes lightly doped source/drain region 211A and source/drain contact region 211B), a rectangular n-type source/drain region 212 (which includes lightly doped source/drain region 212A and source/drain contact region 212B), gate dielectric 221, polysilicon gate finger 231, dielectric sidewall spacers 241-242 and metal silicide regions 251-253. A p-type channel/body region 215 exists between the source/drain region 211 and the source/drain region 212.

N-channel SOI CMOS transistor 202 includes a rectangular n-type source/drain region 212 (which includes lightly doped source/drain region 212C and source/drain contact region 212B), a rectangular n-type source/drain region 213 (which includes lightly doped source/drain region 213A and source/drain contact region 213B), gate dielectric 222, polysilicon gate finger 232, dielectric sidewall spacers 243-244 and metal silicide regions 253-255. A p-type channel/body region 216 exists between the source/drain region 212 and the source/drain region 213.

N-channel SOI CMOS transistor 203 includes a rectangular n-type source/drain region 213 (which includes lightly doped source/drain region 213C and source/drain contact region 213B), a rectangular n-type source/drain region 214 (which includes lightly doped source/drain region 214A and source/drain contact region 214B), gate dielectric 223, polysilicon gate finger 233, dielectric sidewall spacers 245-246 and metal silicide regions 255-257. A p-type channel/body region 217 exists between the source/drain region 213 and the source/drain region 214. A p-type channel/body region 218 extends under polysilicon base region 234, and is continuous with the p-type channel/body regions 215-217.

A multi-layer interconnect structure is fabricated over transistors 201-203, thereby providing electrical connections to these transistors (and other devices fabricated in the thin silicon layer 206). In the example illustrated, a pre-metal dielectric (PMD) structure 260 is formed over transistors 201-203. Metal contacts, which are illustrated as squares containing an "X" in FIG. 2A, extend through the PMD structure 260 and contact underlying metal silicide regions, thereby providing electrical connections to underlying silicon structures. For example, metal contacts 261-262 provide electrical connections to source/drain region 211 (via metal silicide region 251), metal contact 263 provides an electrical connection to source/drain region 212 (via metal silicide region 253), metal contacts 264-265 provide electrical connections to source/drain region 213 (via metal silicide region 255) and metal contact 266 provides an electrical connection to source/drain region 214 (via metal silicide region 257). The contacts associated with source/drain regions 211-214 are 'staggered' in the manner illustrated by FIG. 2A. More specifically, the contacts on the left sides of source/drain regions 211 and 213 are arranged in a single column, while the contacts on the right sides of source/drain regions 211 and 213 are arranged in two columns. Conversely, the contacts on the right sides of source/drain regions 212 and 214 are arranged in a single column, while the contacts on the left sides of source/drain regions 212 and 214 are arranged in two columns. The inclusion of two columns of contacts on half of each source/drain region enables the RF switch 200 to meet insertion loss requirements by providing a low on-resistance. The staggered contact configuration of FIG. 2A enables a constant pitch (P) between adjacent sets of contacts. In accordance with a conventional 0.18 micron SOI CMOS process node, the pitch (P) between the adjacent sets of source/drain regions is 0.7 microns.

A first metal layer (M1), including metal traces 271-276, is formed over PMD structure 260. Note that the metal traces 271-274 are tapered to conform to the general layout of the underlying contacts, thereby maximizing the spacing between adjacent metal traces 271-274.

To implement an RF switch, the structure of FIG. 2A is typically expanded to include up to 30 or more series-connected transistors to meet a desired power requirement (e.g., each of the stacks 110, 111, 120 and 121 can include up to 30 or more series-connected transistors). Moreover, hundreds of these series-connected transistor stacks can be connected in parallel to achieve a desired resistance of the RF switch. As a result, the RF switch requires a significant layout area. It would therefore be desirable to have an improved SOI CMOS transistor structure for implementing an RF switch, wherein the required layout area of the RF switch is minimized, while maintaining the low on-resistance and capacitance of the RF switch. It would further be desirable if this improved SOI CMOS transistor structure can be fabricated using conventional fabrication process nodes.

SUMMARY

Accordingly, the present invention provides a SOI CMOS transistor structure for use in a radio frequency (RF) switch, wherein the transistor structure includes an active semiconductor region located on a buried dielectric layer, wherein the active region includes a plurality of source/drain regions having a first conductivity type separated by a plurality of channel/body regions having a second conductivity type, wherein each of the source/drain regions includes a first source/drain portion having a first length along a first axis and a second source/drain portion having a second length along the first axis. A plurality of polysilicon gate fingers extend over the plurality of channel/body regions, wherein each polysilicon gate finger includes a first rectangular portion, a second rectangular portion and a connector portion that joins the first and second rectangular portions, wherein the connector portion introduces an offset between the first and second rectangular portions along the first axis, wherein the offset causes the second length to be greater than the first length. First sets of contacts provide contact to the first source/drain portions, wherein each of the first sets of contacts includes a single column of contacts that is aligned along a second axis. Each of the first sets of contacts has a first width along the first axis. Second sets of contacts provide contact to the second source/drain portions, wherein each of the second sets of contacts includes a single column of contacts aligned along the second axis. Each of the second sets of contacts has a second width along the first axis, wherein the second width is greater than the first width. In a particular embodiment, the second width is twice the first width. This configuration allows the resulting SOI CMOS transistor structure to exhibit a compact layout, without requiring any modifications to conventional SOI CMOS process nodes. A relatively low on-resistance (and capacitance) is maintained, thereby allowing the SOI CMOS transistor structure to be used in an RF switch. In accordance with one embodiment, a layout reduction of more than 15 percent is realized by the improved SOI CMOS transistor structure.

The present invention will be more fully understood in view of the following description and drawings.

DETAILED DESCRIPTION

In general, the present invention includes an improved semiconductor structure for implementing a plurality of SOI CMOS transistors connected in series. In one embodiment, the series-connected SOI CMOS transistors are used to implement an RF switch. The SOI CMOS transistors are fabricated in accordance with a conventional SOI CMOS process node. In accordance with the present invention, the polysilicon gate fingers of the SOI CMOS transistors are 'bent' near a central location, in a manner that provides each source/drain region with both a narrow portion and a wide portion between adjacent polysilicon gate fingers. First sets of contacts, each including a first number of columns, are formed over the narrow portions of the source/drain regions, and second sets of contacts, each including a second number of columns (greater than the first number of columns), are formed over the wide portions of the source/drain regions. This configuration advantageously allows the pitch between adjacent sets of contacts to be minimized, thereby reducing the required layout area of the SOI CMOS transistors. The present invention is described in more detail below.

Figure 1:
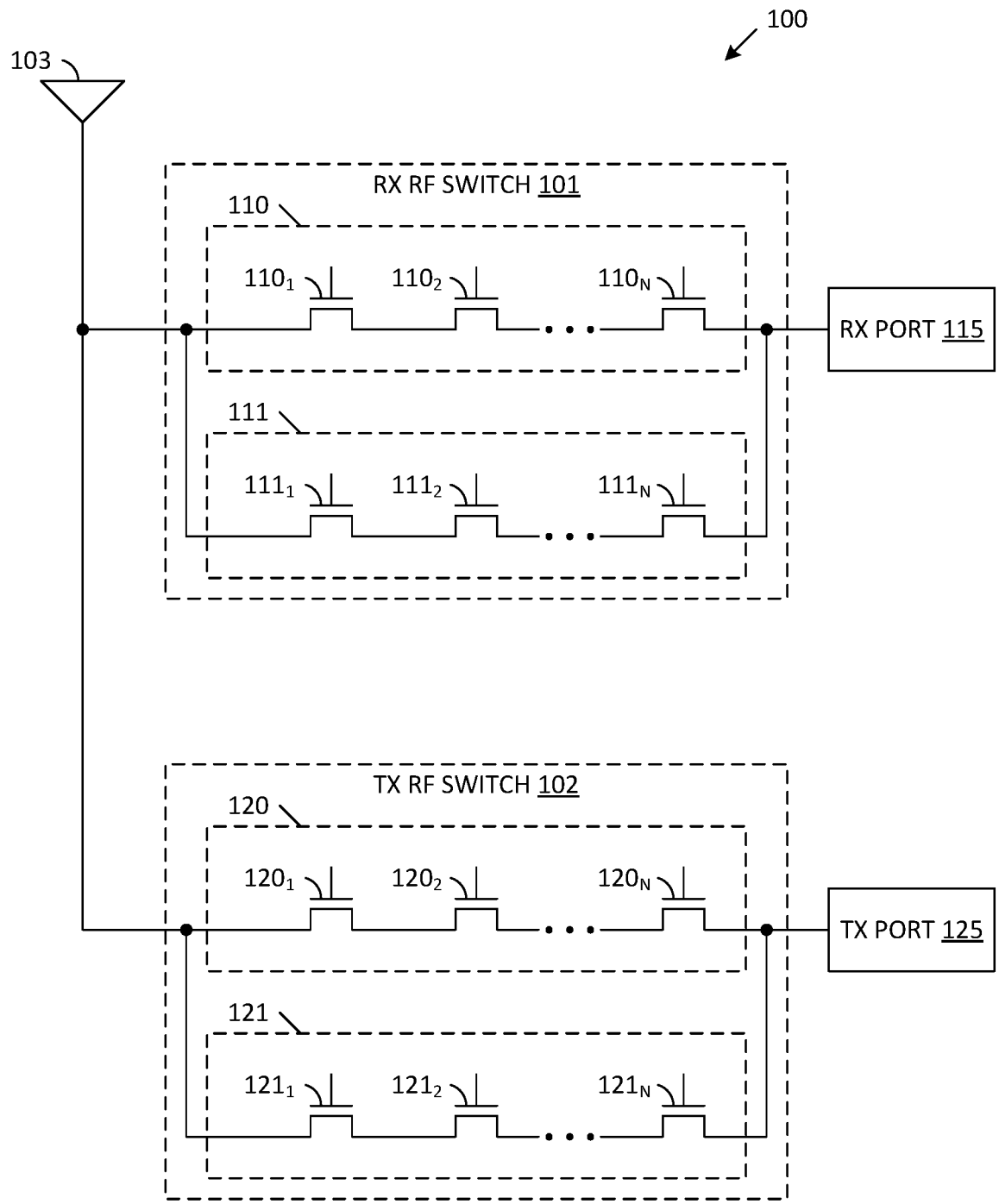
FIG. 1 is a circuit diagram of a conventional RF switch structure.
Figure 3A:
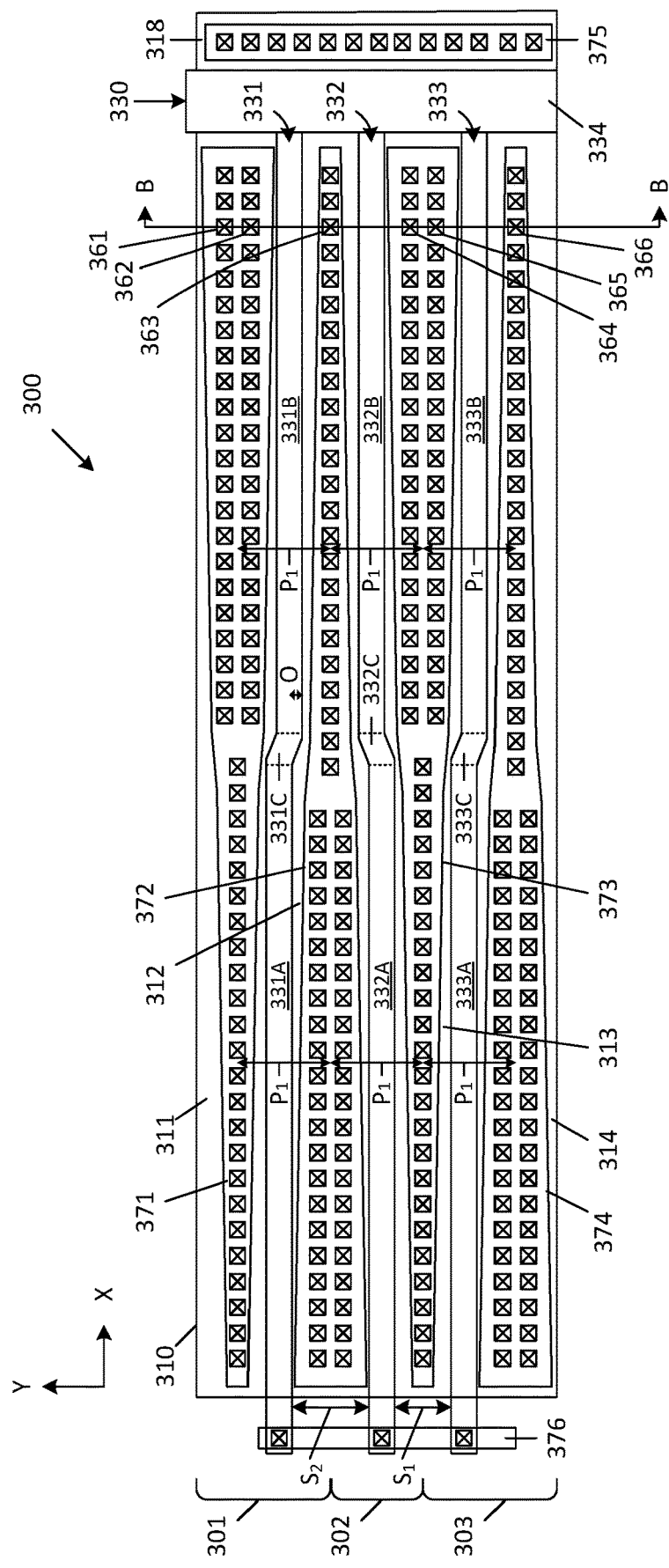
FIG. 3A is a top layout view of a SOI CMOS transistor structure that includes series-connected n-channel SOI CMOS transistors in accordance with one embodiment of the present invention.
Figure 3B:
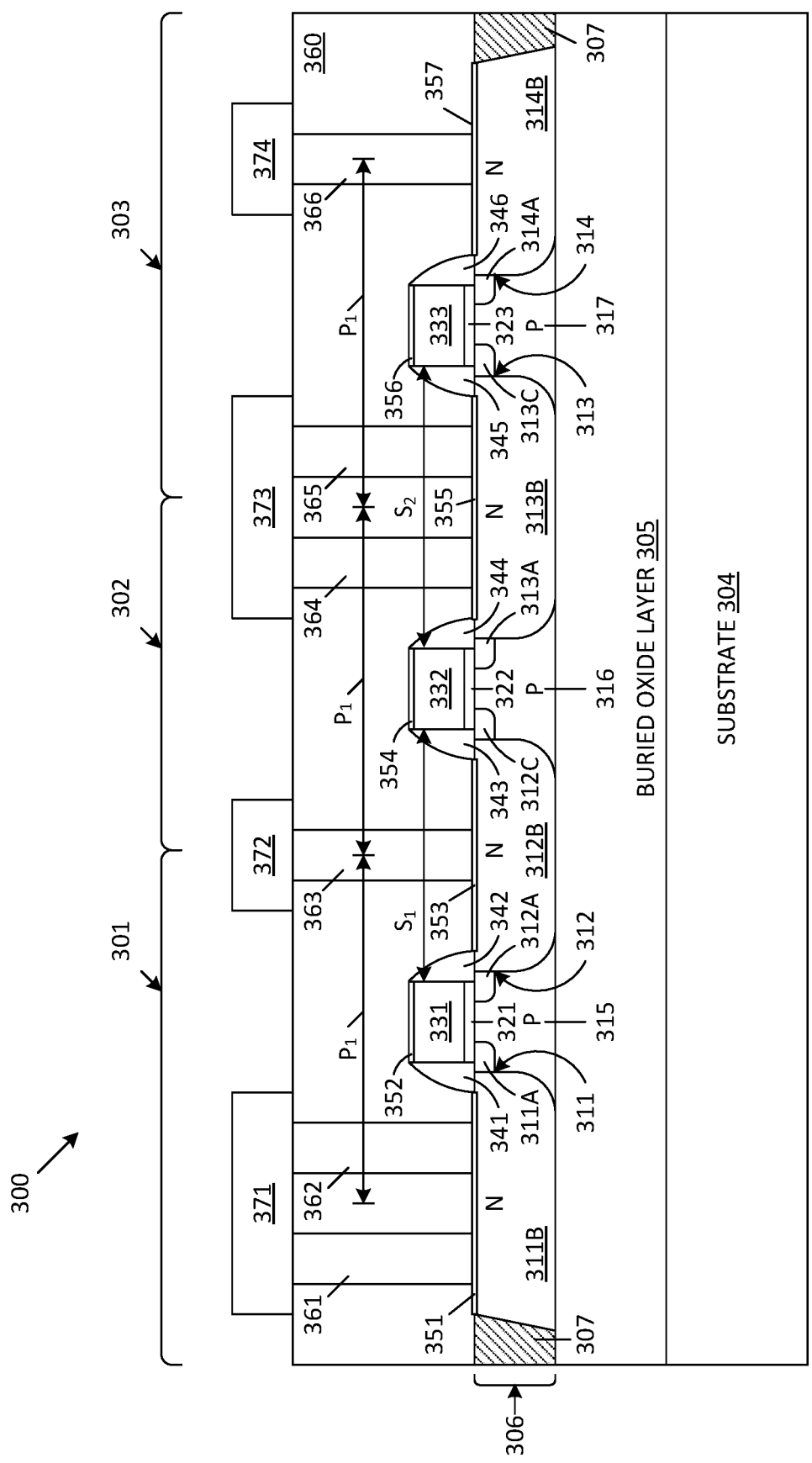
FIG. 3B is a cross sectional view of the SOI CMOS transistors of FIG. 3A along section line B-B.

FIG. 3A is a top view of a SOI CMOS transistor structure 300, which includes n-channel SOI CMOS transistors 301-303 fabricated in an active semiconductor region 310 in accordance with one embodiment of the present invention. In the described embodiment, transistors 301-303 and the associated multi-layer interconnect structure are fabricated in accordance with a conventional 0.18 micron SOI CMOS process node. However, it is understood that other process nodes can be used in other embodiments. FIG. 3B is a cross-sectional view of SOI CMOS structure 300 along section line B-B of FIG. 3A. Note that not all of the elements of SOI CMOS structure 300 are shown in FIG. 3A for clarity. In accordance with one embodiment of the present invention, transistors similar to re-channel SOI CMOS transistors 301-303 are used to implement series-connected stacks of transistors, similar to the stacks 110, 111, 120 and 120 of FIG. 1. More specifically, the series-connected transistors 301-303 can be used to implement the series-connected transistors $110_1$-$110_N$, $111_1$-$111_N$, $120_1$-$120_N$ or $121_1$-$121_N$ of RF switches 101 and 102 (FIG. 1). Note that although only three transistors 301-303 are illustrated by FIGS. 3A-3B, the disclosed structure 300 can be readily expanded to implement other numbers of series-connected transistors, as required by the particular application. For example, up to thirty series-connected transistors, similar to series connected transistors 301-303 can be used to implement an RF switch. In general, the number of series-connected transistors is selected to achieve a desired power handling requirement of the RF switch. Moreover, although only two parallel stacks 110-111 (or 120-121) are shown for each RF switch 101 (or 102), it is understood that many more parallel stacks may be included to reduce the on-resistance of the corresponding RF switch. For example, hundreds of parallel stacks can be used to achieve a desired on-resistance of a corresponding RF switch. Also note that while n-channel devices 301-303 are described, it is understood that p-channel devices can be implemented by switching the conductivity types of the various regions.

As illustrated by FIG. 3B, SOI CMOS transistors 301-303 are fabricated on a thin silicon layer 306, which is located on a buried insulating layer 305 (e.g., silicon oxide), which in turn, is located on a substrate 304 (e.g., monocrystalline silicon). The rectangular active region 310, which is surrounded by shallow trench isolation region 307, is formed in thin silicon layer 306. In a particular embodiment, thin silicon layer 306 has a thickness in a range of about 300 to 2000 Angstroms.

N-channel SOI CMOS transistor 301 includes an n-type source/drain region 311 (which includes lightly doped source/drain region 311A and source/drain contact region 311B), an n-type source/drain region 312 (which includes lightly doped source/drain region 312A and source/drain contact region 312B), gate dielectric 321, polysilicon gate finger 331, dielectric sidewall spacers 341-342 and metal silicide regions 351-353. A p-type channel/body region 315 exists between the source/drain region 311 and the source/drain region 312.

N-channel SOI CMOS transistor 302 includes an n-type source/drain region 312 (which includes lightly doped source/drain region 312C and source/drain contact region 312B), an n-type source/drain region 313 (which includes lightly doped source/drain region 313A and source/drain contact region 313B), gate dielectric 322, polysilicon gate finger 332, dielectric sidewall spacers 343-344 and metal silicide regions 353-355. A p-type channel/body region 316 exists between the source/drain region 312 and the source/drain region 313.

N-channel SOI CMOS transistor 303 includes an n-type source/drain region 313 (which includes lightly doped source/drain region 313C and source/drain contact region 313B), an n-type source/drain region 314 (which includes lightly doped source/drain region 314A and source/drain contact region 314B), gate dielectric 323, polysilicon gate finger 333, dielectric sidewall spacers 345-346 and metal silicide regions 355-357. A p-type channel/body region 317 exists between the source/drain region 313 and the source/drain region 314.

To implement a RF switch, each of the polysilicon gate fingers 331-333 may have a length (along the Y-axis) of 0.18 microns or more. The width (along the X-axis) of each of the polysilicon gate fingers 331-333 over the active region 310 can be, for example, 7 to 20 microns. In a particular embodiment, each of the polysilicon gate fingers 331-333 has a width of about 15 microns and a length of about 0.19 microns.

P-type channel/body contact region 318 is continuous with the p-type channel regions 315-317 at the right side of the active region 310, thereby providing a path for biasing the p-type channel/body regions 315-317. In an alternate embodiment, the structure of commonly owned, co-pending U.S. patent application Ser. No. 15/788,681 (not yet published), entitled "SILICIDE BLOCK ISOLATION FOR REDUCING OFF-CAPACITANCE OF A RADIO FREQUENCY (RF) SWITCH" by Roda Kanawati can be used to bias the p-type channel/body regions 315-317. To this extent, the contents of Ser. No. 15/788,681 are incorporated by reference.

Dielectric sidewall spacers 341-342, 343-344 and 345-346 are formed adjacent to (and along the entire lengths of) polysilicon gate fingers 331, 332 and 333, respectively. Metal silicide regions 351, 352, 353, 354, 355, 356 and 357 are formed over source/drain region 311, gate finger 331, source/drain region 312, gate finger 332, source/drain region 313, gate finger 333 and source/drain region 314, respectively. A metal silicide region (not shown), continuous with metal silicide regions 352, 354 and 356, is formed over polysilicon region 334. Another metal silicide region (not shown), is formed over p-type channel/body contact region 318.

Figure 2A:
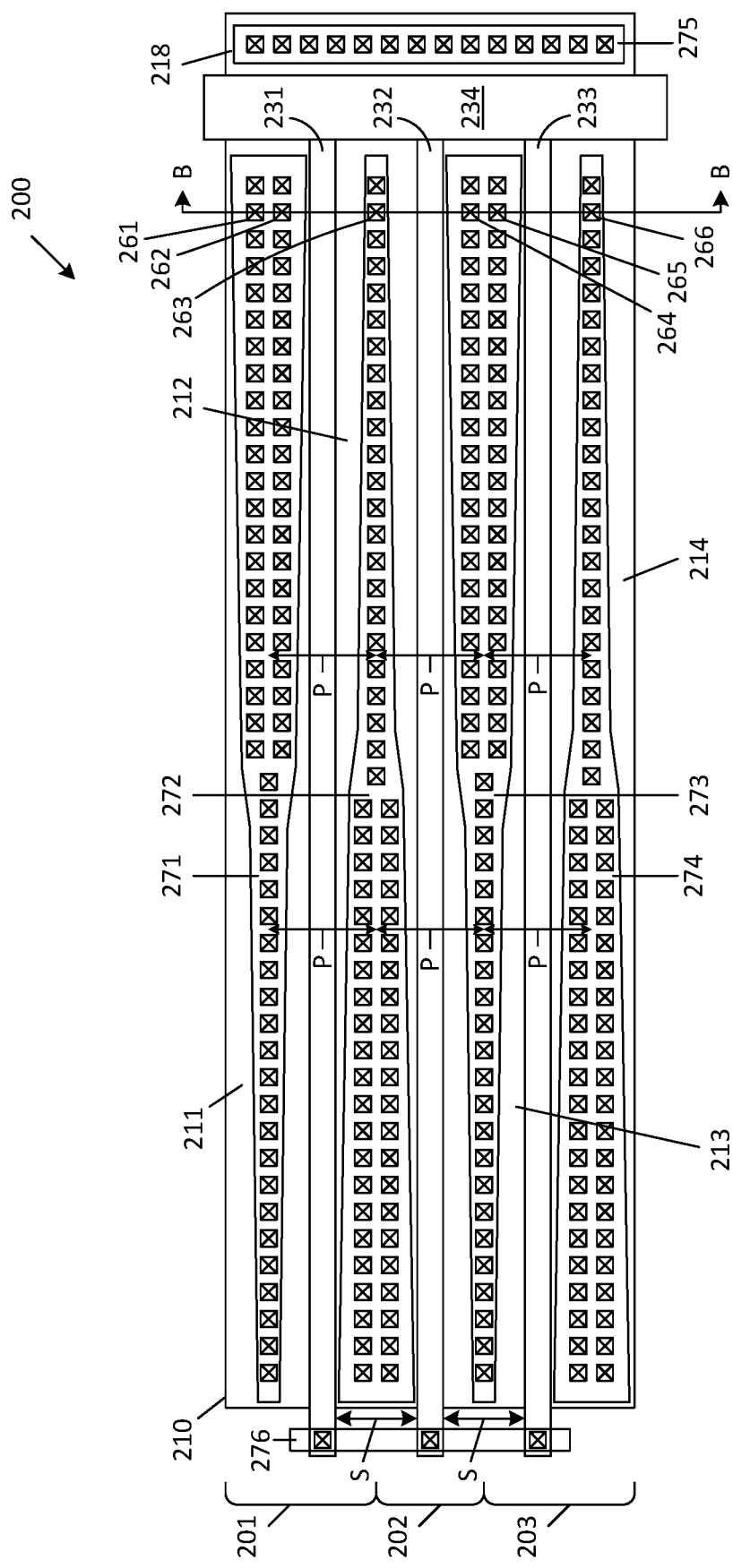
FIG. 2A is a top layout view of a conventional RF switch structure that uses conventional SOI CMOS transistors to implement the RF switch of FIG. 1.
Figure 2B:
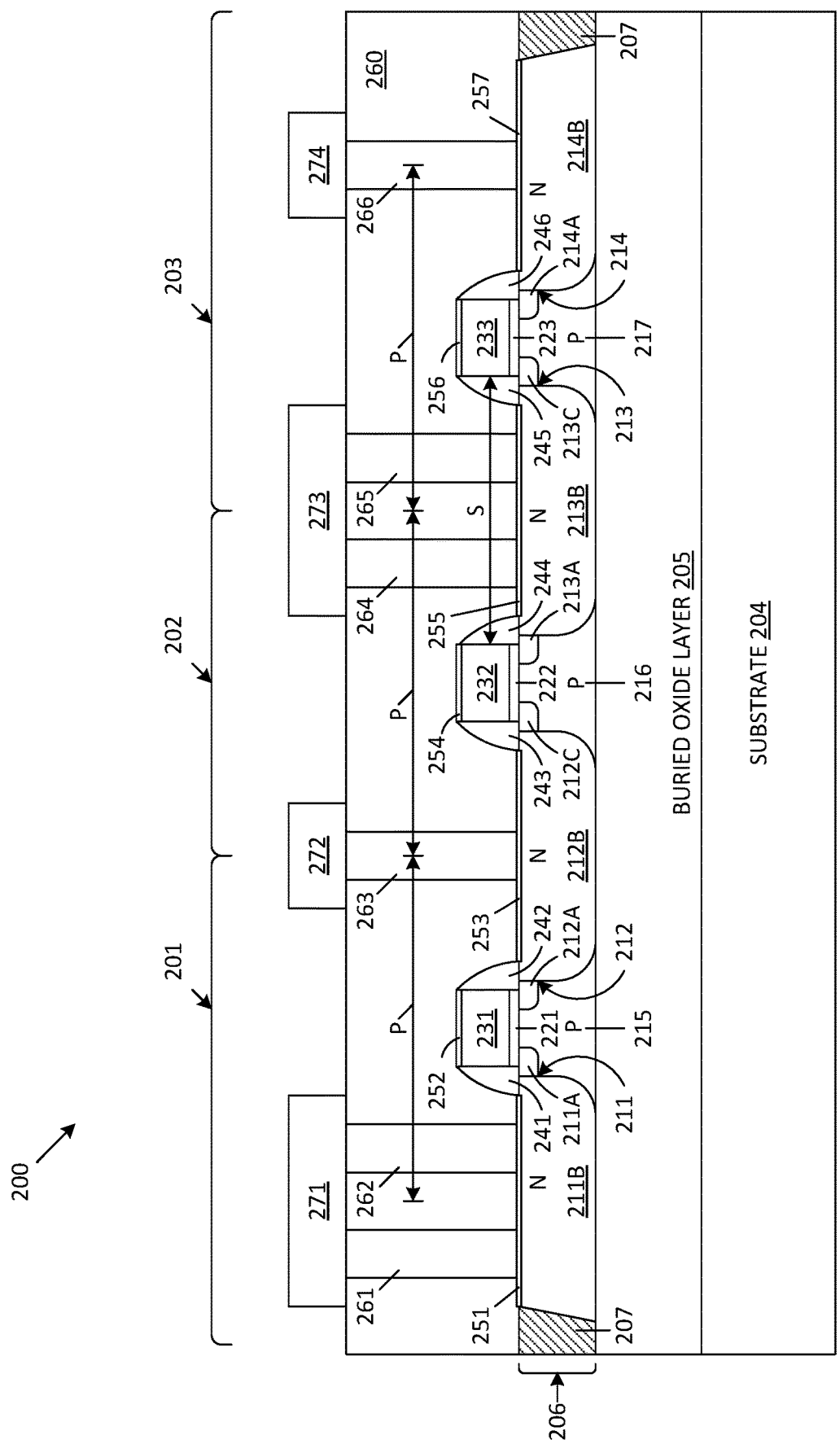
FIG. 2B is a cross sectional view along section line B-B of FIG. 2A.

The SOI CMOS transistor structure 300 of FIGS. 3A-3B is similar to the SOI CMOS transistor structure 200 of FIGS. 2A-2B, with the main difference being that the polysilicon gate structure 330 of FIGS. 3A-3B is different than the polysilicon gate structure 230 of FIGS. 2A-2B, which allows the layout area of transistors 301-303 to be smaller than the layout area of transistors 201-203. More specifically, polysilicon gate structure 330 includes a plurality of polysilicon gate fingers 331-333 that include centrally located 'bent' regions. That is, polysilicon gate fingers 331-333 include first rectangular regions 331A-333A, second rectangular regions 331B-333B, and connector regions 331C-333C, respectively. First and second rectangular regions 331A-333A and 331B-333B each extend in parallel with the X-axis. Connector regions 331C-333C join first rectangular regions 331A-333A and second rectangular regions 331B-333B, respectively, such that the first rectangular regions 331A-333A and the second rectangular regions 331B-333B are offset along the (perpendicular) Y-axis. Stated another way, the first rectangular regions 331A-333A are offset from the corresponding second rectangular regions 331B-333B by an offset distance 'O' along the Y-axis.

The offset structure of polysilicon gate fingers 331-333 results in different Y-axis spacings between different regions of these fingers. Thus, a relatively narrow spacing $S_1$ exists between second rectangular portions 331B and 332B, and between first rectangular portions 332A and 333A. A relatively wide spacing $S_2$ exists between first rectangular regions 331A and 332A and between second rectangular regions 332B and 333B. In accordance with one embodiment, spacing $S_1$ may be about 0.34 microns, and spacing $S_2$ may be about 0.54 microns. However, other spacings are possible in other embodiments. Because the spacings between the polysilicon gate fingers 331-333 define the lengths of the source/drain regions 311-314 along the Y-axis, each of the source/drain regions 311-314 has different lengths along the Y-axis. For example, the left side of source/drain region 312 (FIG. 3A) has a relatively large length of $S_2$, while the right side of source/drain region 312 (FIG. 3A) has a relatively short length of $S_1$. Conversely, the left side of source/drain region 313 (FIG. 3A) has a relatively short length of $S_1$, while the right side of source/drain region 313 (FIG. 3A) has a relatively large length of $S_2$. In this manner, the relatively short length portions of the source/drain regions 311-314 are interleaved with the relatively large length portions of the source/drain regions 311-314 along the Y-axis.

A multi-layer interconnect structure is fabricated over transistors 301-303, thereby providing electrical connections to these transistors (and other devices fabricated in the thin silicon layer 306). In the example illustrated, a pre-metal dielectric (PMD) structure 360 is formed over transistors 301-303. Metal contacts (which are illustrated as squares containing an "X" in FIG. 3A), such as contacts 361, 362, 363, 364, 365 and 366, extend through the PMD structure 360 and contact the silicide regions 351, 351, 353, 355, 355 and 357, respectively, as illustrated by FIG. 2B. In this manner, contacts 361-362, 363, 364-365 and 366 provide electrical connections to source/drain regions 311, 312, 313 and 314, respectively.

Figure 4:
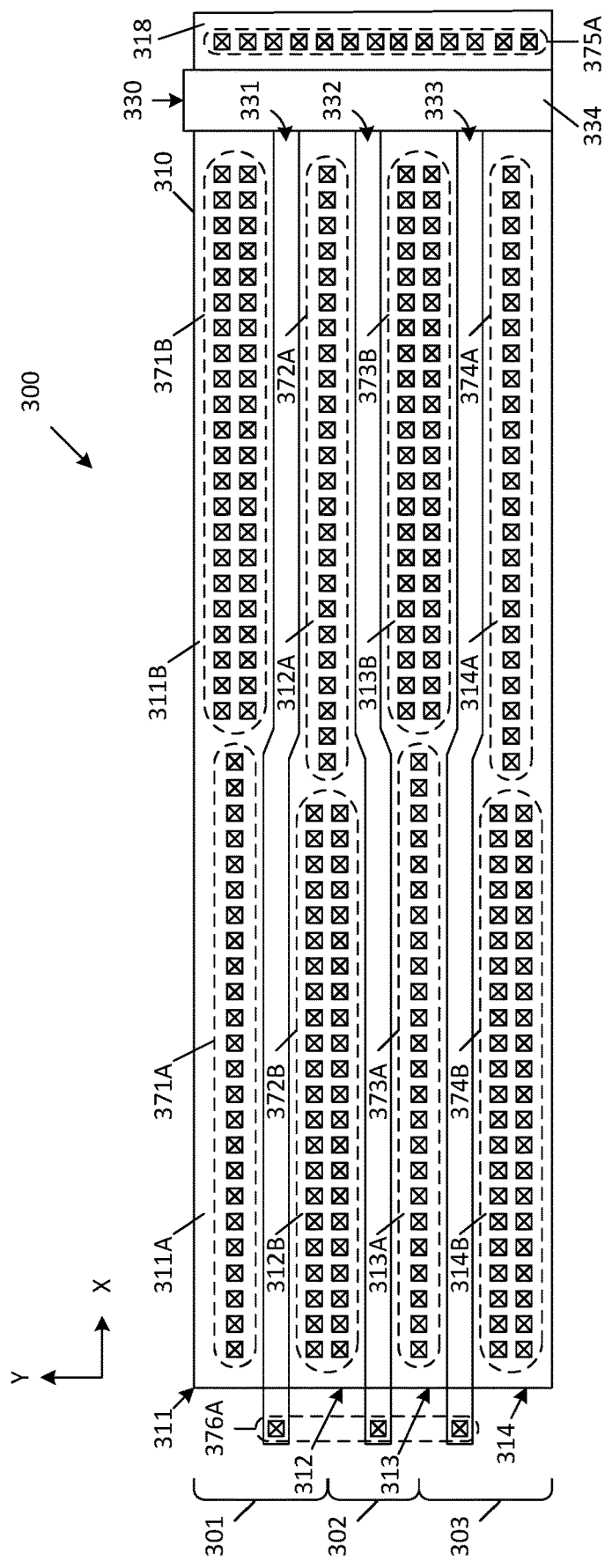
FIG. 4 is a simplified top layout view of the structure of FIG. 3A, clearly labeling the pattern of metal contacts in accordance with one embodiment of the present invention.

FIG. 4 is a simplified view that illustrates active region 310, polysilicon floating gate electrode 330, source/drain regions 311-314 and the various metal contacts. The short length portions of source/drain regions 311, 312, 313 and 314 are labeled as source/drain region portions 311A, 312A, 313A and 314A, respectively. Similarly, the large length portions of source/drain regions 311, 312, 313 and 314 are labeled as source/drain region portions 311B, 312B, 313B and 314B, respectively. As illustrated by FIG. 4, a first plurality of contacts, including a first set of contacts 371A and a second set of contacts 371B, contact the metal silicide region 351 over source/drain portions 311A and 311B, respectively, of source/drain region 311. A second plurality of contacts, including a first set of contacts 372A and a second set of contacts 372B, contact the metal silicide region 353 over source/drain portions 312A and 312B, respectively, of source/drain region 312. A third plurality of contacts, including a first set of contacts 373A and a second set of contacts 373B contact the metal silicide region 355 over source/drain portions 313A and 313B, respectively, of source/drain region 313. A fourth plurality of contacts, including a first set of contacts 374A and a second set of contacts 374B, contact the metal silicide region 357 over source/drain portions 314A and 314B, respectively, of source/drain region 314. Each of the first sets of contacts 371A, 372A, 373A and 374A includes a single column of contacts (which extends in parallel with the X-axis). Each of the second sets of contacts 371B, 372B, 373B and 374B includes two columns of contacts (wherein each column extends in parallel with the X-axis).

Thus, one column of contacts are provided where the source/drain regions 311-314 have a relatively short length ($S_1$), and two columns of contacts are provided where the source/drain regions 311-314 have a relatively large length ($S_2$). In accordance with one embodiment, fewer columns of contacts are located where the polysilicon gate fingers 331-333 are located close to one another (e.g., at spacing $S_1$ in source/drain portions 311A, 312A, 313A and 314A), and more columns of contacts are located where the polysilicon gate fingers 331-333 are located far from one another (e.g., at spacing $S_2$ in source/drain portions 311B, 312B, 313B and 314B). The illustrated example includes one column of contacts over each of the narrow source/drain portions 311A, 312A, 313A and 314A, and two columns of contacts over each of the wider source/drain portions 311B, 312B, 313B and 314B.

The offset structure of polysilicon gate fingers 331-333 allows for a reduced pitch ($P_1$) between the contacts located across the polysilicon gate fingers 331-333 (with respect to the contact-to-contact pitch (P) of conventional transistors 201-203). For example, the pitch $P_1$ between contacts 362-363, 363-364 and 365-366 may be equal to 0.64 microns (wherein the corresponding contact-to-contact pitch P of transistors 201-203 is 0.70 microns). This reduced contact-to-contact pitch allows SOI CMOS transistors 301-303 to be fabricated with a smaller layout area than conventional SOI CMOS transistors 201-203. In one example, the reduced contact-to-contact pitch allows the layout area of transistors 301-303 to be smaller than the layout area of transistors 201-203 by 11 percent or more.

The reduced layout area of transistors 301-303 advantageously allows more of these transistors to be fabricated on a given die area. Thus, for a given die area, the number of parallel stacks of series-connected transistors used to implement an RF switch can be increased, thereby reducing the on-resistance (and the insertion loss) of the RF switch. Viewed in another manner, the reduced layout area of transistors 301-303 allows for the use of a smaller die size when implementing an RF switch having a given number of transistors.

As illustrated by FIG. 4, an additional set of metal contacts 376A extend through the PMD structure 360 and contact the silicide regions 352, 354 and 356, thereby providing electrical connections to polysilicon gate fingers 331-333. Another set of metal contacts 375A extend through the PMD structure 360 and contact the silicide region formed on p-type channel/body contact region 318.

A first metal layer (M1), including metal traces 371-376, is formed over PMD structure 360. Additional dielectric layers, metal vias and metal layers (not shown) are formed over the PMD structure 360 and the first metal layer (M1) in a manner known in the art. Metal trace 371 is formed on the sets of metal contacts 371A and 371B, thereby providing an electrical connection to the underlying source/drain region 311. Similarly, metal trace 372 is formed on the sets of metal contacts 372A and 372B, thereby providing an electrical connection to the underlying source/drain region 312. Metal trace 373 is formed on the sets of metal contacts 373A and 373B, thereby providing an electrical connection to the underlying source/drain region 313. Metal trace 374 is formed on the sets of metal contacts 374A and 374B, thereby providing an electrical connection to the underlying source/drain region 314.

Each of the metal traces 371-374 is tapered to follow the outline of the corresponding sets of metal contacts, such that each of the metal traces 371-374 is located over its corresponding source/drain region 311-314. For example, metal trace 372 is tapered to follow the outline of the sets of metal contacts 372A and 372B, whereby metal trace 372 has a larger length (along the Y-axis) over the second set of metal contacts 372B than over the first set of metal contacts 372A. This configuration allows for a consistent minimum spacing between the adjacent metal traces 371-374 along their entire widths, thereby providing for adequate isolation between adjacent metal traces. Note that metal traces 375 and 376 are connected to corresponding sets of metal contacts 375A and 376A in the illustrated embodiment.

In the manner described above, the required layout area of the series-connected SOI CMOS transistors 301-303 is advantageously minimized, while maintaining the desirable operating characteristics of an associated RF switch (e.g., insertion loss). Advantageously, the SOI CMOS transistor structure 300 can be fabricated using conventional SOI CMOS processing node.

In accordance with another embodiment, each of the second sets of contacts 371B, 372B, 373B and 374B (each of which includes multiple parallel columns of contacts as described above) is replaced with modified set of contacts, wherein each modified set of contacts includes a single column of relatively wide contacts. As described in more detail below, the use of wide contacts allows the required layout area of the resulting RF switch to be further reduced, while advantageously maintaining a low on-resistance of the resulting RF switch.

Figure 5A:
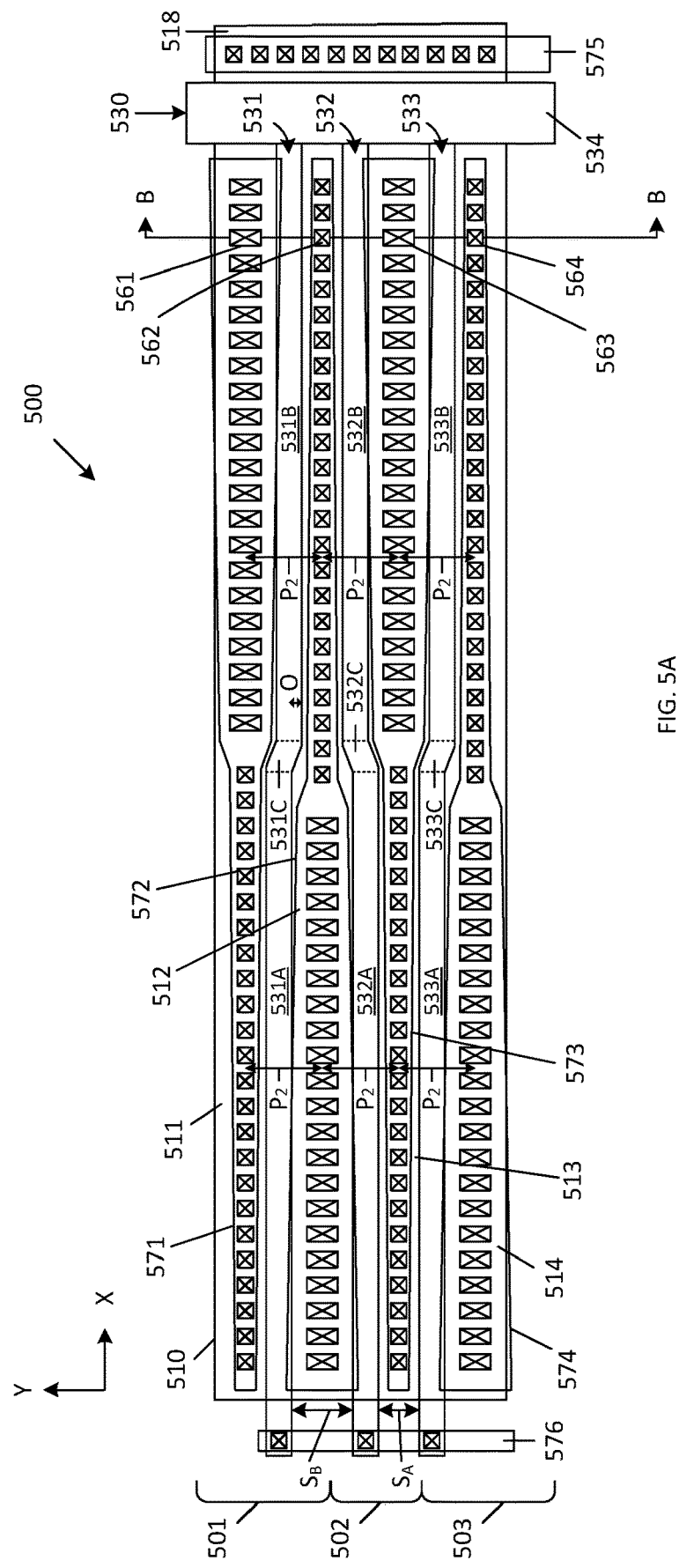
FIG. 5A is a top layout view of a SOI CMOS transistor structure that includes series-connected n-channel SOI CMOS transistors in accordance with an alternate embodiment of the present invention.
Figure 5B:
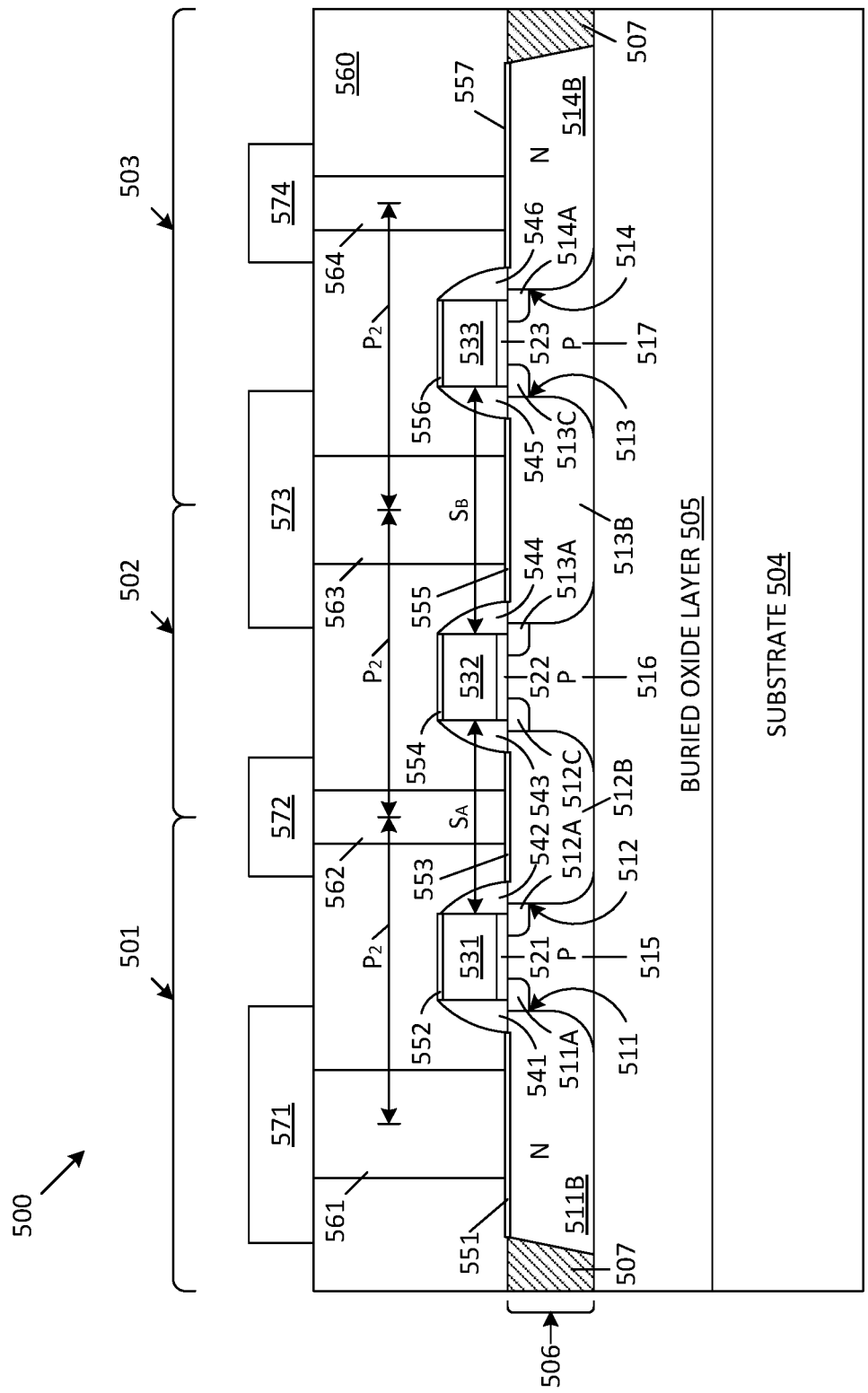
FIG. 5B is a cross sectional view of the SOI CMOS transistors of FIG. 5A along section line B-B.

FIG. 5A is a top view of a SOI CMOS transistor structure 500, which includes n-channel SOI CMOS transistors 501-503 fabricated in an active semiconductor region 510 in accordance with one embodiment of the present invention. In the described embodiment, transistors 501-503 and the associated multi-layer interconnect structure are fabricated in accordance with a conventional 0.18 micron SOI CMOS process node. However, it is understood that other process nodes can be used in other embodiments. FIG. 5B is a cross-sectional view of SOI CMOS structure 500 along section line B-B of FIG. 5A. Note that not all of the elements of SOI CMOS structure 500 are shown in FIG. 5A for clarity. In accordance with one embodiment of the present invention, transistors similar to re-channel SOI CMOS transistors 501-503 are used to implement series-connected stacks of transistors, similar to the stacks 110, 111, 120 and 120 of FIG. 1. More specifically, the series-connected transistors 501-503 can be used to implement the series-connected transistors $110_1$-$110_N$, $111_1$-$111_N$, $120_1$-$120_N$ or $121_1$-$121_N$ of RF switches 101 and 102 (FIG. 1). Note that although only three transistors 501-503 are illustrated by FIGS. 5A-5B, the disclosed structure 500 can be readily expanded to implement other numbers of series-connected transistors, as required by the particular application. For example, up to thirty series-connected transistors, similar to series connected transistors 501-503 can be used to implement an RF switch. In general, the number of series-connected transistors is selected to achieve a desired power handling requirement of the RF switch. Moreover, although only two parallel stacks 110-111 (or 120-121) are shown for each RF switch 101 (or 102), it is understood that many more parallel stacks may be included to reduce the on-resistance of the corresponding RF switch. For example, hundreds of parallel stacks can be used to achieve a desired on-resistance of a corresponding RF switch. Also note that while n-channel devices 501-503 are described, it is understood that p-channel devices can be implemented by switching the conductivity types of the various regions.

As illustrated by FIG. 5B, SOI CMOS transistors 501-503 are fabricated on a thin silicon layer 506, which is located on a buried insulating layer 505 (e.g., silicon oxide), which in turn, is located on a substrate 504 (e.g., monocrystalline silicon). The rectangular active region 510, which is surrounded by shallow trench isolation region 507, is formed in thin silicon layer 506. In a particular embodiment, thin silicon layer 506 has a thickness in a range of about 300 to 2000 Angstroms.

N-channel SOI CMOS transistor 501 includes an n-type source/drain region 511 (which includes lightly doped source/drain region 511A and source/drain contact region 511B), an n-type source/drain region 512 (which includes lightly doped source/drain region 512A and source/drain contact region 512B), gate dielectric 521, polysilicon gate finger 531, dielectric sidewall spacers 541-542 and metal silicide regions 551-553. A p-type channel/body region 515 exists between the source/drain region 511 and the source/drain region 512.

N-channel SOI CMOS transistor 502 includes an n-type source/drain region 512 (which includes lightly doped source/drain region 512C and source/drain contact region 512B), an n-type source/drain region 513 (which includes lightly doped source/drain region 513A and source/drain contact region 513B), gate dielectric 522, polysilicon gate finger 532, dielectric sidewall spacers 543-544 and metal silicide regions 553-555. A p-type channel/body region 516 exists between the source/drain region 512 and the source/drain region 513.

N-channel SOI CMOS transistor 503 includes an n-type source/drain region 513 (which includes lightly doped source/drain region 513C and source/drain contact region 513B), an n-type source/drain region 514 (which includes lightly doped source/drain region 514A and source/drain contact region 514B), gate dielectric 523, polysilicon gate finger 533, dielectric sidewall spacers 545-546 and metal silicide regions 555-557. A p-type channel/body region 517 exists between the source/drain region 513 and the source/drain region 514.

Polysilicon gate fingers 531-533 are joined by continuous polysilicon connector section 534, thereby forming polysilicon gate structure 530. To implement a RF switch, each of the polysilicon gate fingers 531-533 may have a length (along the Y-axis) of 0.18 microns or more. The width (along the X-axis) of each of the polysilicon gate fingers 531-533 over the active region 510 can be, for example, 7 to 20 microns. In a particular embodiment, each of the polysilicon gate fingers 531-533 has a width of about 15 microns and a length of about 0.19 microns.

P-type channel/body contact region 518 is continuous with the p-type channel regions 515-517 at the right side of the active region 510 (FIG. 5A), thereby providing a path for biasing the p-type channel/body regions 515-517. In an alternate embodiment, the structure of commonly owned, co-pending U.S. patent application Ser. No. 15/788,681, "SILICIDE BLOCK ISOLATION FOR REDUCING OFF-CAPACITANCE OF A RADIO FREQUENCY (RF) SWITCH" by Roda Kanawati can be used to bias the p-type channel/body regions 515-517. To this extent, the contents of Ser. No. 15/788,681 are incorporated by reference.

Dielectric sidewall spacers 541-542, 543-544 and 545-546 are formed adjacent to (and along the entire lengths of) polysilicon gate fingers 531, 532 and 533, respectively. Metal silicide regions 551, 552, 553, 554, 555, 556 and 557 are formed over source/drain region 511, gate finger 531, source/drain region 512, gate finger 532, source/drain region 513, gate finger 533 and source/drain region 514, respectively. A metal silicide region (not shown), continuous with metal silicide regions 552, 554 and 556, is formed over polysilicon region 534. Another metal silicide region (not shown), is formed over p-type channel/body contact region 518.

The polysilicon gate fingers 531-533 of structure 500 are similar to the corresponding polysilicon gate fingers 331-333 of structure 300. Thus, polysilicon gate fingers 531-533 include centrally located 'bent' regions. More specifically, polysilicon gate fingers 531-533 include first rectangular regions 531A-533A, second rectangular regions 531B-533B, and connector regions 531C-533C, respectively. The first rectangular regions 531A-533A are offset from the corresponding second rectangular regions 531B-533B by an offset distance 'O' along the Y-axis. As will become apparent in view of the following description, the spacing between adjacent polysilicon gate fingers 531-533 is smaller than the spacing between adjacent polysilicon gate fingers 331-333.

The offset structure of polysilicon gate fingers 531-533 results in different Y-axis spacings between different regions of these fingers. Thus, a relatively narrow spacing $S_A$ exists between second rectangular portions 531B and 532B, and between first rectangular portions 532A and 533A. A relatively wide spacing $S_B$ exists between first rectangular regions 531A and 532A and between second rectangular regions 532B and 533B. In accordance with one embodiment, spacing $S_A$ may be about 0.24 microns, and spacing $S_B$ may be about 0.44 microns. However, other spacings are possible in other embodiments. Because the spacings between the polysilicon gate fingers 531-533 define the lengths of the source/drain regions 511-514 along the Y-axis, each of the source/drain regions 511-514 has different lengths along the Y-axis. For example, the left side of source/drain region 512 (FIG. 5A) has a relatively large length of $S_B$, while the right side of source/drain region 512 (FIG. 5A) has a relatively short length of $S_A$. Conversely, the left side of source/drain region 513 (FIG. 5A) has a relatively short length of $S_A$, while the right side of source/drain region 513 (FIG. 5A) has a relatively large length of $S_B$. In this manner, the relatively short length portions of the source/drain regions 511-514 are interleaved with the relatively large length portions of the source/drain regions 511-514 along the Y-axis.

A multi-layer interconnect structure is fabricated over transistors 501-503, thereby providing electrical connections to these transistors (and other devices fabricated in the thin silicon layer 506). In the example illustrated, a pre-metal dielectric (PMD) structure 560 is formed over transistors 501-503. Metal contacts (which are illustrated as squares and rectangles containing an "X" in FIG. 5A), such as contacts 561, 562, 563 and 564, extend through the PMD structure 560 and contact the silicide regions 551, 553, 555 and 557, respectively, as illustrated by FIG. 5B. In this manner, contacts 561, 562, 563 and 564 provide electrical connections to source/drain regions 511, 512, 513 and 514, respectively.

Figure 6:
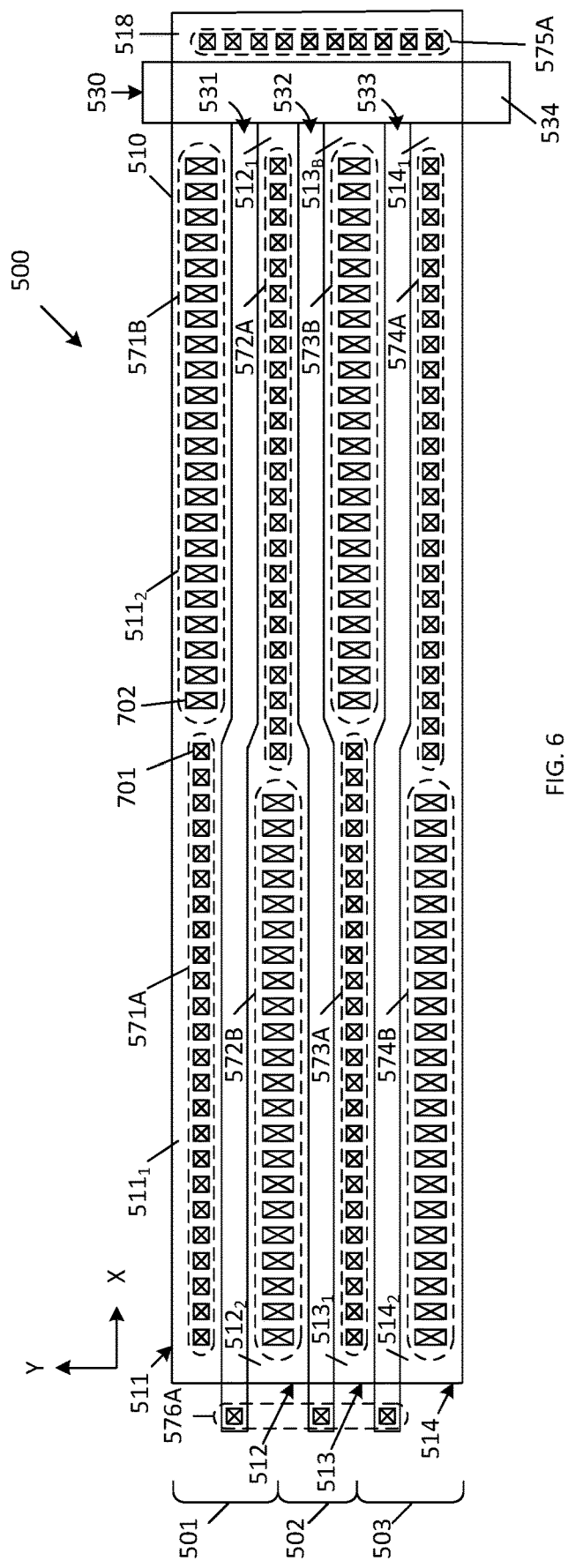
FIG. 6 is a simplified top layout view of the structure of FIG. 5A, clearly labeling the pattern of metal contacts in accordance with one embodiment of the present invention.

FIG. 6 is a simplified view that illustrates active region 510, polysilicon floating gate electrode 530, source/drain regions 511-514 and the various metal contacts. The short length ($S_A$) portions of source/drain regions 511, 512, 513 and 514 are labeled as source/drain region portions $511_1$, $512_1$, $513_1$ and $514_1$, respectively. Similarly, the long length ($S_B$) portions of source/drain regions 511, 512, 513 and 514 are labeled as source/drain region portions $511_2$, $512_2$, $513_2$ and $514_2$, respectively. As illustrated by FIG. 6, a first plurality of contacts, including a first set of contacts 571A and a second set of contacts 571B, contact the metal silicide region 551 over source/drain portions $511_1$ and $511_2$, respectively, of source/drain region 511. A second plurality of contacts, including a first set of contacts 572A and a second set of contacts 572B, contact the metal silicide region 553 over source/drain portions $512_1$ and $512_2$, respectively, of source/drain region 512. A third plurality of contacts, including a first set of contacts 573A and a second set of contacts 573B contact the metal silicide region 555 over source/drain portions $513_1$ and $513_2$, respectively, of source/drain region 513. A fourth plurality of contacts, including a first set of contacts 574A and a second set of contacts 574B, contact the metal silicide region 557 over source/drain portions $514_1$ and $514_2$ respectively, of source/drain region 514.

Each of the first sets of contacts 571A, 572A, 573A and 574A includes a single column of contacts (which extends in parallel with the X-axis). Similarly, each of the second sets of contacts 571B, 572B, 573B and 574B includes a single column of contacts (wherein each column extends in parallel with the X-axis).

Figure 7:
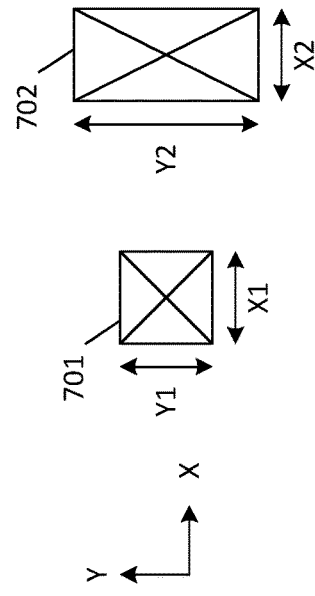
FIG. 7 is a top view of the different types of metal contacts used in accordance with one embodiment of the present invention.

FIG. 7 is a top view of an exemplary contact 701 of the first set of contacts 571A and an exemplary contact 702 of the second set of contacts 572B. In the described embodiments, each of the contacts in the first sets of contacts 571A, 572A, 573A and 574A are identical to contact 701, and each of the contacts in the second sets of contacts 571B, 572B, 573B and 574B is identical to contact 702. Contact 701 has a width Y1 along the y-axis and a length X1 along the x-axis. In one embodiment, the width Y1 and length X1 are defined by the conventional minimum contact sizes of the process used to fabricate the structure 500. For example, when using a 0.18 micron SOI CMOS process with a 90 nm back-end process (for contacts, vias and metals), contact 701 has a width Y1 of 0.1 microns and a length X1 of 0.1 microns. In the described embodiments, the contact 701 has the same size as each of the contacts of semiconductor structure 300 (FIGS. 3A-3B and 4). Although contact 701 has a square cross section in the described embodiment, it is understood that contact 701 can have a rectangular cross section in other embodiments.

Contact 702 has a width Y2 along the y-axis, and a length X2 along the x-axis. In one embodiment, the length X2 is equal to the length X1, such that each of the contacts has the same length along the x-axis. In one embodiment, the width Y2 is twice as large as the width Y1, such that the width of the contact 702 along the y-axis is twice the width of the contact 701 along the y-axis. In such an embodiment, the first sets of contacts 571A, 572A, 573A and 574A may be referred to as single-width columns of contacts, while the second sets of contacts 571B, 572B, 573B and 574B may be referred to as double-width columns of contacts. In accordance with another embodiment, the width Y2 of contact 702 is simply greater than the width Y1 of contact 701 (although not necessarily by a factor of 2).

In the illustrated embodiment, one single-width column of contacts is provided where the source/drain regions 511-514 have a relatively short length ($S_A$) (e.g., over source/drain portions $511_2$, $512_2$, $513_2$ and $514_2$), and one double-width column of contacts is provided where the source/drain regions 511-514 have a relatively large length ($S_B$) (e.g., over source/drain portions $511_2$, $512_2$, $513_2$ and $514_2$). That is, smaller-width columns of contacts are located where the polysilicon gate fingers 531-533 are located close to one another (e.g., at spacing $S_A$ in source/drain portions $511_1$, $512_1$, $513_1$ and $514_1$), and larger-width columns of contacts are located where the polysilicon gate fingers 531-533 are located far from one another (e.g., at spacing $S_B$ in source/drain portions $511_2$, $512_2$, $513_2$ and $514_2$).

The offset structure of polysilicon gate fingers 531-533 allows for a reduced pitch ($P_2$) between the contacts located across the polysilicon gate fingers 531-533 (with respect to the contact-to-contact pitch (P) of conventional transistors 201-203, and with respect to the contact-to-contact pitch ($P_1$) of transistors 301-303). For example, the pitch $P_2$ between contacts 561-562, 562-563 and 563-564 may be equal to 0.54 microns (wherein the corresponding contact-to-contact pitch P of transistors 201-203 is 0.70 microns, and the corresponding contact-to-contact pitch $P_1$ of transistors 301-303 is 0.64 microns). This reduced contact-to-contact pitch allows SOI CMOS transistors 501-503 to be fabricated with a smaller layout area than conventional SOI CMOS transistors 201-203 or SOI CMOS transistors 301-303). In one example, the reduced contact-to-contact pitch allows the layout area of transistors 501-503 to be smaller than the layout area of transistors 301-303 by about 15 percent or more.

The reduced layout area of transistors 501-503 advantageously allows more of these transistors to be fabricated on a given die area. Thus, for a given die area, the number of parallel stacks of series-connected transistors used to implement an RF switch can be increased, thereby reducing the on-resistance (and the insertion loss) of the RF switch. Viewed in another manner, the reduced layout area of transistors 501-503 allows for the use of a smaller die size when implementing an RF switch having a given number of transistors. The capacitances associated with the metal contacts and the associated metal 1 traces of semiconductor structure 500 are advantageously substantially the same as the capacitances associated with the metal contacts and the associated metal 1 traces of semiconductor structures 200 and 300. Note that the capacitances between the metal 1 traces 571-574 of the semiconductor structure 500 are slightly reduced by shrinking the metal 1 traces 571-574 (with respect to the metal traces 271-274 and 371-374 of semiconductor structures 200 and 300), while the capacitances between the metal 1 traces 571-574 are slightly increased by reducing the spacing between these metal 1 traces 571-574 (with respect to the metal traces 271-274 and 371-374 of semiconductor structures 200 and 300).

As illustrated by FIG. 6, an additional set of metal contacts 576A extend through the PMD structure 560 and contact the silicide regions 552, 554 and 556, thereby providing electrical connections to polysilicon gate fingers 531-533. Another set of metal contacts 575A extend through the PMD structure 560 and contact the silicide region formed on p-type channel/body contact region 518.

A first metal layer (M1), including metal traces 571-576, is formed over PMD structure 560. Additional dielectric layers, metal vias and metal layers (not shown) are formed over the PMD structure 560 and the first metal layer (M1) in a manner known in the art. Metal trace 571 is formed on the sets of metal contacts 571A and 571B, thereby providing an electrical connection to the underlying source/drain region 511. Similarly, metal trace 572 is formed on the sets of metal contacts 572A and 572B, thereby providing an electrical connection to the underlying source/drain region 512. Metal trace 573 is formed on the sets of metal contacts 573A and 573B, thereby providing an electrical connection to the underlying source/drain region 513. Metal trace 574 is formed on the sets of metal contacts 574A and 574B, thereby providing an electrical connection to the underlying source/drain region 514.

Each of the metal traces 571-574 is tapered to follow the outline of the corresponding sets of metal contacts, such that each of the metal traces 571-574 is located over its corresponding source/drain region 511-514. For example, metal trace 572 is tapered to follow the outline of the sets of metal contacts 572A and 572B, whereby metal trace 572 has a larger length (along the Y-axis) over the second set of metal contacts 572B than over the first set of metal contacts 572A. This configuration allows for a consistent minimum spacing between the adjacent metal traces 571-574 along their entire widths, thereby providing for adequate isolation between adjacent metal traces. Note that metal traces 575 and 576 are connected to corresponding sets of metal contacts 575A and 576A in the illustrated embodiment.

In the manner described above, the required layout area of the series-connected SOI CMOS transistors 501-503 is advantageously minimized, while maintaining the desirable operating characteristics of an associated RF switch (e.g., insertion loss). Advantageously, the SOI CMOS transistor structure 500 can be fabricated using conventional SOI CMOS processing node.

Although the invention has been described in connection with several embodiments, it is understood that this invention is not limited to the embodiments disclosed, but is capable of various modifications, which would be apparent to a person skilled in the art. Thus, the invention is limited only by the following claims.

The invention claimed is:

1. A semiconductor structure comprising:
   an active semiconductor region located on a buried dielectric layer, wherein the active semiconductor region includes a plurality of source/drain regions having a first conductivity type separated by a plurality of channel/body regions having a second conductivity type, wherein each of the source/drain regions includes a first source/drain portion having a first length along a first axis and a second source/drain portion having a second length along the first axis;
   a plurality of polysilicon gate fingers, each located over a corresponding one of the plurality of channel/body regions, wherein each polysilicon gate finger includes a first rectangular portion, a second rectangular portion and a connector portion that joins the first and second rectangular portions, wherein the connector portion introduces an offset between the first and second rectangular portions along the first axis, wherein the offset causes the second length to be greater than the first length;

first sets of contacts that contact the first source/drain portions, wherein each of the first sets of contacts includes a single column of contacts that is aligned along a second axis, and wherein each of the first sets of contacts has a first width along the first axis; and second sets of contacts that contact the second source/drain portions, wherein each of the second sets of contacts includes a single column of contacts aligned along the second axis, and wherein each of the second sets of contacts has a second width along the first axis, wherein the second width is greater than the first width.

2. The semiconductor structure of claim 1, wherein contacts in the first sets of contacts and contacts in the second sets of contacts have identical widths along the second axis.

3. The semiconductor structure of claim 1, wherein each of the single columns of contacts in the first and second sets of contacts extend in parallel with the second axis.

4. The semiconductor structure of claim 1, wherein the first axis is perpendicular to the second axis.

5. The semiconductor structure of claim 1, wherein each of the plurality of polysilicon gate fingers is continuous with a polysilicon connector.

6. The semiconductor structure of claim 1, wherein the first and second rectangular portions of the polysilicon gate fingers are located in parallel with the second axis.

7. The semiconductor structure of claim 1, wherein the second width is equal to two times the first width.

8. The semiconductor structure of claim 1, further comprising a metal layer that includes a plurality of metal traces, wherein each metal trace contacts a corresponding one of the first set of contacts and a corresponding one of the second set of contacts.

9. The semiconductor structure of claim 8, wherein each metal trace is wider over the corresponding one of the second set of contacts than over the corresponding one of the first set of contacts.

10. The semiconductor structure of claim 1, wherein the active semiconductor region is rectangular.

11. The semiconductor structure of claim 1, wherein each of the first rectangular portions of the polysilicon gate fingers has a same size as each of the second rectangular portions of the polysilicon gate fingers over the active semiconductor region.

12. The semiconductor structure of claim 1, wherein the first source/drain portion of each source/drain region is adjacent to the second source/drain portion of an adjacent source/drain region across a corresponding one of the plurality of channel/body regions.

13. The semiconductor structure of claim 1, wherein each of the first sets of contacts is located adjacent to corresponding ones of the second sets of contacts across the polysilicon gate fingers.

14. The semiconductor structure of claim 13, wherein a constant pitch exists between each of the first sets of contacts and the adjacent second sets of contacts across the polysilicon gate fingers.

15. A semiconductor structure comprising:

an active semiconductor region located on a buried dielectric layer, wherein the active semiconductor region includes:
  a first source/drain region including a first source/drain portion having a first length along a first axis and a continuous second source/drain portion having a second length along the first axis, greater than the first length,
  a second source/drain region including a third source/drain portion having a third length along the first axis and a continuous fourth source/drain portion having a fourth length along the first axis, greater than the third length, and
  a channel/body region located between the first and second source/drain regions, wherein the first source/drain portion and the fourth source/drain portion are adjacent across the channel/body region, and the second source/drain portion and the third source/drain portion are adjacent across the channel/body region;

a gate electrode located over the channel/body region;

a first plurality of contacts that contact the first source/drain portion, wherein the first plurality of contacts are arranged in a single column along a second axis;

a second plurality of contacts that contact the second source/drain portion, wherein the second plurality of contacts are arranged in a single column along the second axis;

a third plurality of contacts that contact the third source/drain portion, wherein the third plurality of contacts are arranged in a single column along the second axis; and a fourth plurality of contacts that contact the fourth source/drain portion, wherein the fourth plurality of contacts are arranged a single column along the second axis, wherein the first and third plurality of contacts have a first width along the first axis, and the second and fourth plurality of contacts have a second width along the first axis, wherein the second width is greater than the first width.

16. The semiconductor structure of claim 15, wherein the polysilicon gate finger includes a first rectangular portion, a second rectangular portion and a connector portion that joins the first and second rectangular portions, wherein the connector portion introduces an offset between the first and second rectangular portions.

17. The semiconductor structure of claim 15, wherein the second width is twice the first width.

18. The semiconductor structure of claim 15, further comprising a first metal trace that connects the first and second plurality of contacts, and a second metal trace that connects the third and fourth plurality of contacts.

19. The semiconductor structure of claim 18, wherein the first metal trace is wider over the second plurality of contacts than over the first plurality of contacts, and the second metal trace is wider over the fourth plurality of contacts than the third plurality of contacts.

20. The semiconductor structure of claim 15, wherein the first axis is perpendicular to the second axis.

* * * * *